(12) United States Patent
Sim

(10) Patent No.: US 7,651,933 B2
(45) Date of Patent: Jan. 26, 2010

(54) METHOD OF FABRICATING SEMICONDUCTOR DEVICE

(75) Inventor: Guee-Hwang Sim, Gangneung-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 69 days.

(21) Appl. No.: 11/951,162

(22) Filed: Dec. 5, 2007

(65) Prior Publication Data

US 2009/0053879 A1    Feb. 26, 2009

(30) Foreign Application Priority Data

Aug. 24, 2007    (KR) .................. 10-2007-0085417

(51) Int. Cl.
*H01L 21/22* (2006.01)

(52) U.S. Cl. .................. 438/561; 438/242; 438/246; 257/E29.201; 257/E21.546; 257/E21.548; 257/E21.549; 257/E21.551

(58) Field of Classification Search .............. 438/244, 438/561, 700; 257/301, E21.346, 396, 546, 257/E29.26, 257
See application file for complete search history.

(56) References Cited

U.S. PATENT DOCUMENTS

| 6,165,871 A * | 12/2000 | Lim et al. ............. 438/437 |
| 6,696,365 B2 * | 2/2004 | Kumar et al. ............ 438/706 |
| 7,049,206 B2 | 5/2006 | Akram |
| 2003/0129547 A1 * | 7/2003 | Neisser et al. ............ 430/322 |

FOREIGN PATENT DOCUMENTS

| KR | 1020030059411 A | 7/2003 |
| KR | 1020070001553 A | 1/2007 |

* cited by examiner

*Primary Examiner*—Charles D Garber
*Assistant Examiner*—Yasser A Abdelaziez
(74) *Attorney, Agent, or Firm*—Townsend and Townsend and Crew LLP

(57) ABSTRACT

A method of fabricating a semiconductor device includes providing a semiconductor substrate in which a gate insulating layer and a pad layer are formed in an active region. A first trench is formed in an isolation region of the substrate. A passivation film is formed to cover the pad layer and fill the first trench. A second trench is formed by patterning the pad layer and removing an exposed semiconductor substrate, the second trench being formed within the first trench. An ion implantation process is performed on the semiconductor substrate exposed through the second trench.

20 Claims, 2 Drawing Sheets

METHOD OF FABRICATING SEMICONDUCTOR DEVICE

CROSS-REFERENCES TO RELATED APPLICATIONS

The present application claims priority to Korean patent application number 10-2007-85417, filed on Aug. 24, 2007, which is incorporated by reference in its entirety.

BACKGROUND OF THE INVENTION

The present invention relates to a method of fabricating a semiconductor device and, more particularly, to a method of fabricating a semiconductor device, in which a dual trench structure can be easily formed in a high voltage region by using a passivation film.

In non-volatile memory devices such as flash memory devices, a high voltage is used in order to perform erase and write operations. To use this high voltage, a high voltage transistor capable of passing or switching the high voltage is used.

A process of forming a high voltage transistor having a general dual trench structure is as follows. A gate insulating layer for insulation is formed over a semiconductor substrate. A pad layer for protecting underlying layers is formed on the gate insulating layer. A hard mask pattern in which a trench region is opened is formed on the pad layer. An etch process is performed along the hard mask pattern, thus patterning the pad layer and the gate insulating layer. An exposed semiconductor substrate is removed to form a first trench.

In order to form a dual trench structure, a photoresist is formed over the semiconductor substrate in which the first trench is formed. The photoresist is a fluid material and is thus formed along the surface of the semiconductor substrate including the trench and the pad layer. Accordingly, it is difficult to form the photoresist thickly because a subsequent exposure process must be performed. If the photoresist is formed thick, not only the exposure process along the pattern, but also a development process is difficult. For this reason, the photoresist is formed thin. In particular, the photoresist is formed thin at the corners of the pad layer.

At the time of an ion implantation process performed on the semiconductor substrate in which a subsequent second trench is formed, an impurity can be implanted into the photoresist film. The impurity can be implanted into the core regions of the pad layer in which the thickness of the photoresist is thin. If the impurity is implanted into the pad layer, electrical properties may vary when the semiconductor device is operated subsequently. It may result in degraded reliability of the semiconductor device.

BRIEF SUMMARY OF THE INVENTION

According to the present embodiments, during the process of forming a dual trench, a passivation film is thickly formed instead of a photoresist and a photoresist is formed on the passivation film. At the time of an ion implantation process, an impurity can be prevented from being implanted into a transistor region by means of the passivation film.

In one embodiment, a method of fabricating a semiconductor device includes providing a semiconductor substrate in which a gate insulating layer and a pad layer are formed in an active region and a first trench is formed in an isolation region, forming a passivation film to fully cover the pad layer, patterning the pad layer and removing an exposed semiconductor substrate, thus forming a second trench, and performing an ion implantation process on the semiconductor substrate exposed through the second trench.

In another embodiment, a method of fabricating a semiconductor device includes providing a semiconductor substrate having a step between an active region and an isolation region, forming a passivation film on the semiconductor substrate, forming a photoresist pattern on the passivation film, and patterning the passivation film along the photoresist pattern.

In another embodiment, a method of fabricating a semiconductor device includes, in a process of forming a dual trench, forming a hard mask pattern on a semiconductor substrate, performing a first etch process along the hard mask pattern, thus forming a first trench in the semiconductor substrate, removing the hard mask pattern, forming a passivation film over the semiconductor substrate in which the first trench is formed, forming a photoresist pattern on the passivation film, and performing an etch process along the photoresist pattern to pattern the passivation film, and forming a second trench in an exposed semiconductor substrate.

According to the present embodiments, at the time of a process of forming a dual trench, the passivation film that can be formed thickly compared with the photoresist is used. Thus, at the time of an ion implantation process performed on a semiconductor substrate in which a subsequent dual trench is formed, an impurity can be prevented from being implanted into transistors and the electrical properties of the transistors can be improved.

DESCRIPTION OF SPECIFIC EMBODIMENTS

Specific embodiments according to the present invention will be described with reference to the accompanying drawings.

FIGS. 1A to 1D are cross-sectional views illustrating a method of fabricating a semiconductor device according to the present embodiment.

Figure 1A:
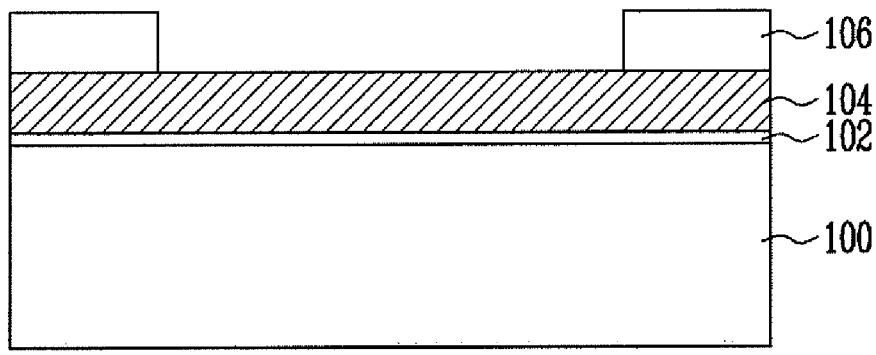
FIGS. 1A to 1D are cross-sectional views illustrating a method of fabricating a semiconductor device according to the present invention.

Referring to FIG. 1A, there is provided a semiconductor substrate 100 including a cell region and a peri region. A method of forming the peri region in which a high voltage transistor is formed is described below.

A gate insulating layer 102 for insulation, a pad layer 104 for protecting underlying layers, and a hard mask pattern 106 in which an isolation region is opened are sequentially formed over the semiconductor substrate 100. The insulating layer 102 may be formed of an oxide layer, and the pad layer 104 may be formed of a nitride layer.

Figure 1B:
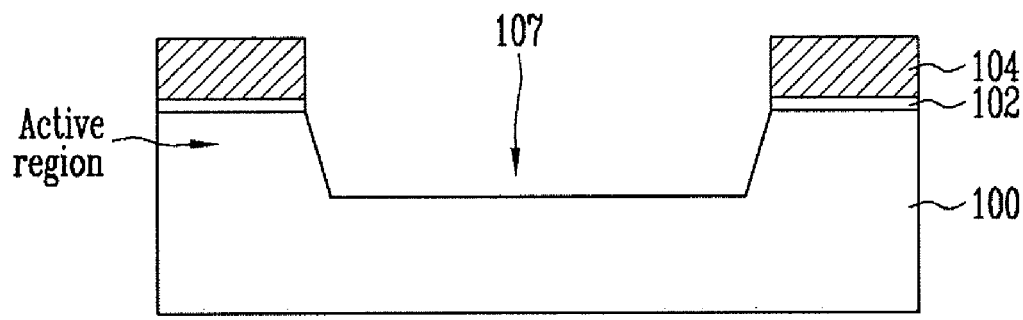

Referring to FIG. 1B, an etch process is performed along the hard mask pattern (refer to 106 of FIG. 1A), thus sequentially patterning the pad layer 104 and the insulating layer 102. A part of the semiconductor substrate 100, which is exposed through the patterning, is removed to form a first trench 107. The hard mask pattern is then removed.

Figure 1C:
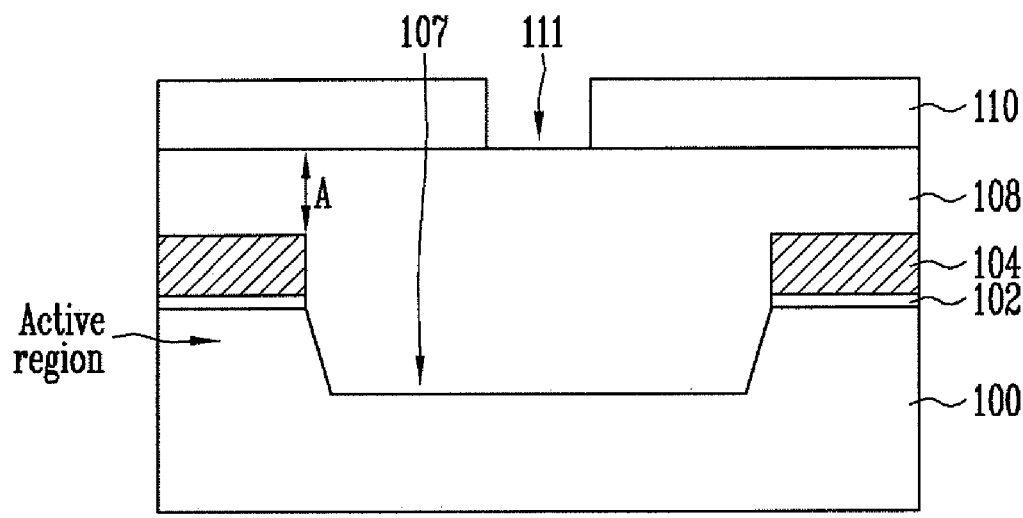

Referring to FIG. 1C, a passivation film 108 is formed to fully cover the first trench 107. In particular, the passivation film 108 is formed by using a developer-soluble gap-fill material having an anti-reflection coating (ARC) characteristic. For example, the passivation film 108 can be formed by using a film of a polymer component having a characteristic of an organic ARC or an inorganic ARC film, which can be removed by a developer. The passivation film 108 may be formed in a temperature range of 30 to 110 degrees Celsius for 30 to 180 seconds.

The passivation film 108 is a fluid material and is thus formed by means of a spin coating method. The passivation film 108 may be formed to a thickness thicker than that of the photoresist. In particular, at the time of a subsequent ion implantation process, the passivation film 108 may be formed to a thickness in which an impurity is not implanted into the pad layer 104.

A bake process is then performed to crosslink the physical properties of the passivation film 108. A photoresist pattern 110 in which a second trench region 111 is opened is formed on the passivation film 108.

The process of forming the photoresist pattern 110 is described in detail below. A photoresist is formed on the passivation film 108, and the bake process is performed to crosslink the photoresist. An exposure process is performed along a pattern of a dual trench region, thereby de-crosslinking a region that will be removed from the photoresist. In other words, the physical properties of the region that will be removed from the photoresist are changed so that the region can be removed by a developer. A post exposure bake (PEB) process is performed. Thus, acid diffuses from a region on which the PEB process has been performed to the passivation film 108. The diffusion direction of acid is generally a vertical direction from the passivation film 108 to the semiconductor substrate 100. Accordingly, a region into which acid has diffused within the passivation film 108 can be easily removed by a subsequent developer.

Figure 1D:
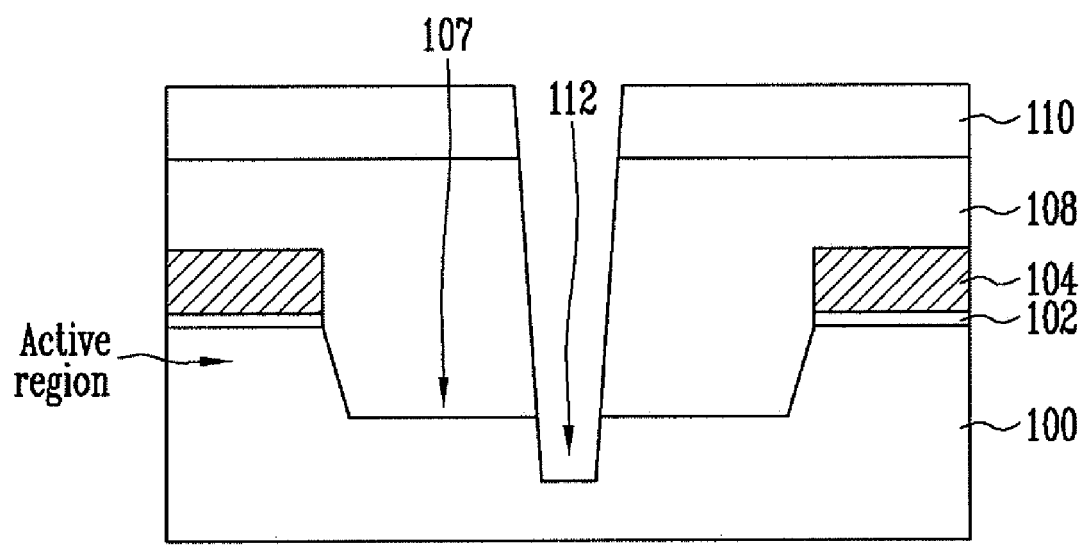

Referring to FIG. 1D, an etch process is performed along the photoresist pattern 110, thus patterning the passivation film 108. A part of the semiconductor substrate 100, which has been exposed through the patterning, is removed to form a second trench 112. At this time, as described above with reference to FIG. 1C, the patterning process can be easily performed due to a change of the physical properties of the passivation film 108.

An ion implantation process for preventing movement of a subsequent high voltage is then performed on the semiconductor substrate 100 exposed through the second trench 112. At this time, since the passivation film 108 and the photoresist pattern 110 are formed over the pad layer 104, implantation of an impurity due to the ion implantation process can be prevented.

Although the foregoing description has been made with reference to the specific embodiments, it is to be understood that changes and modifications of the present invention may be made by the ordinary skilled in the art without departing from the spirit and scope of the present invention and appended claims.

What is claimed is:

1. A method of fabricating a semiconductor device, the method comprising:
   providing a semiconductor substrate in which a gate insulating layer and a pad layer are formed in an active region and a first trench is formed in an isolation region;
   forming a passivation film to cover the pad layer and fill the first trench;
   forming a second trench within the first trench by patterning the passivation film and removing an exposed semiconductor substrate, wherein the patterned passivation film remains on the pad layer; and
   performing an ion implantation process on the semiconductor substrate exposed through the second trench.

2. The method of claim 1, wherein the pad layer is formed using a nitride layer.

3. The method of claim 1, wherein the passivation film is formed by using a film of a polymer component having a characteristic of an organic anti-reflection coating (ARC) which is removable by a developer or an inorganic ARC film.

4. The method of claim 1, wherein the passivation film is formed using a spin coating method for 30 to 180 seconds.

5. The method of claim 1, wherein the passivation film is formed in a temperature range of 30 to 110 degrees Celsius.

6. The method of claim 1, wherein the passivation film is crosslinked using a pre-exposure bake process.

7. The method of claim 1, wherein the passivation film has a de-crosslinking physical property compared with before an exposure process using a post exposure bake process.

8. A method of fabricating a semiconductor device, the method comprising:
   providing a semiconductor substrate having a step between an active region and an isolation region;
   forming a passivation film over the semiconductor substrate, wherein the passivation film is formed by using a film of a polymer component having a characteristic of an organic anti-reflection coating (ARC) or an inorganic ARC film;
   forming a photoresist pattern over the passivation film; and
   patterning the passivation film along the photoresist pattern.

9. The method of claim 8, wherein the organic anti-reflection coating (ARC) is removable by a developer.

10. The method of claim 8, wherein the passivation film is formed using a spin coating method for 30 to 180 seconds.

11. The method of claim 8, wherein the passivation film is formed in a temperature range of 30 to 110 degrees Celsius.

12. The method of claim 8, wherein the passivation film is crosslinked using a pre-exposure bake process.

13. The method of claim 8, wherein the passivation film has a de-crosslinking physical property compared with before an exposure process using a post exposure bake process.

14. A method of fabricating a semiconductor device, the method comprising:
   forming a hard mask pattern over a semiconductor substrate;
   performing a first etch process along the hard mask pattern, thus forming a first trench in the semiconductor substrate;
   removing the hard mask pattern;
   forming a passivation film over the semiconductor substrate and filling the first trench, wherein the passivation film is formed by using a film of a polymer component having a characteristic of an organic anti-reflection coating (ARC) or an inorganic ARC film;
   forming a photoresist pattern over the passivation film; and
   forming a second trench by performing an etch process along the photoresist pattern to pattern the passivation film and etching an exposed semiconductor substrate.

15. The method of claim 14, wherein the second trench is formed within the first trench.

16. The method of claim 14, wherein the organic anti-reflection coating (ARC) is removable by a developer.

17. The method of claim 14, wherein the passivation film is formed using a spin coating method for 30 to 180 seconds.

18. The method of claim 14, wherein the passivation film is formed in a temperature range of 30 to 110 degrees Celsius.

19. The method of claim 14, wherein the passivation film is crosslinked using a pre-exposure bake process.

20. The method of claim 14, wherein the passivation film has a de-crosslinking physical property compared with before an exposure process using a post exposure bake process.

* * * * *